US012716724B2

(12) United States Patent
Koda et al.

(10) Patent No.: US 12,716,724 B2
(45) Date of Patent: Aug. 25, 2026

(54) INFORMATION PROCESSING DEVICE, CONTROL METHOD, PROGRAM, AND STORAGE MEDIUM

(71) Applicants: PIONEER CORPORATION, Tokyo (JP); PIONEER SMART SENSING INNOVATIONS CORPORATION, Tokyo (JP)

(72) Inventors: Takeshi Koda, Kawagoe (JP); Itaru Takemura, Kawagoe (JP)

(73) Assignees: PIONEER CORPORATION, Tokyo (JP); PIONEER SMART SENSING INNOVATIONS CORPORATION, Tokyo (JP)

( * ) Notice: Subject to any disclaimer, the term of this patent is extended or adjusted under 35 U.S.C. 154(b) by 390 days.

(21) Appl. No.: 18/548,470

(22) PCT Filed: Mar. 1, 2021

(86) PCT No.: PCT/JP2021/007698
§ 371 (c)(1),
(2) Date: Aug. 30, 2023

(87) PCT Pub. No.: WO2022/185377
PCT Pub. Date: Sep. 9, 2022

(65) Prior Publication Data

US 2024/0151534 A1 May 9, 2024

(51) Int. Cl.
*H04N 7/12* (2006.01)
*G01C 21/00* (2006.01)
(Continued)

(52) U.S. Cl.
CPC ........ *G01C 21/005* (2013.01); *B64U 2101/00* (2023.01); *H03M 7/6011* (2013.01)

(58) Field of Classification Search
CPC ............. G01C 21/005; B64U 2101/00; H03M 7/6011; H03M 7/6094; H03M 7/607;
(Continued)

(56) References Cited

U.S. PATENT DOCUMENTS 7,804,981 B2 * 9/2010 Viggiano ................. G08G 5/22 382/104
7,844,077 B2 * 11/2010 Kochi ....................... G06T 7/74 382/103
(Continued)

FOREIGN PATENT DOCUMENTS

JP 2018-009831 A 1/2018
JP 2018-116452 A 7/2018
(Continued)

OTHER PUBLICATIONS

Patent Cooperation Treaty, International Search Report, Application No. PCT/JP2021/007698, dated May 18, 2021, in 4 pages.
(Continued)

*Primary Examiner* — Gims S Philippe
(74) *Attorney, Agent, or Firm* — Procopio, Cory, Hargreaves & Savitch LLP

(57) ABSTRACT

A controller 13 of the information processing device 1 according to the present embodiment is configured to acquire measured data outputted by a sensor group 2 that is measurement equipment. Then, the controller 13 is configured to determine a compression mode of the measured data, based on the compression related information I1 regarding compression mode of data in accordance with a position and/or a posture. Then, the controller 13 compresses the measured data based on the determined compression mode.

8 Claims, 7 Drawing Sheets

(51) Int. Cl.
*B64U 101/00* (2023.01)
*H03M 7/30* (2006.01)

(58) Field of Classification Search
CPC .. H04N 19/174; H04N 19/162; H04N 19/137; H04N 19/172; H04N 19/132; G06V 20/17; G01S 7/4808; G01S 7/003
USPC .................................................... 375/240.12
See application file for complete search history.

(56) References Cited

U.S. PATENT DOCUMENTS

| | | | | |
|---|---|---|---|---|
| 8,862,987 | B2 * | 10/2014 | Haussecker | H04N 23/698 715/244 |
| 2009/0316012 | A1 * | 12/2009 | Matos | H04N 23/60 348/E7.001 |
| 2013/0027554 | A1 * | 1/2013 | Meadow | G06T 7/33 348/E7.085 |
| 2016/0162519 | A1 * | 6/2016 | Stowe | E21B 47/135 707/755 |
| 2019/0033459 | A1 | 1/2019 | Tisdale et al. | |
| 2019/0179022 | A1 | 6/2019 | Agarwal | |
| 2019/0266396 | A1 * | 8/2019 | Greveson | G06F 18/22 |
| 2020/0033849 | A1 * | 1/2020 | Yiu | H04W 76/27 |
| 2020/0088504 | A1 | 3/2020 | Boudet et al. | |
| 2020/0249359 | A1 | 8/2020 | Tisdale et al. | |
| 2021/0035454 | A1 | 2/2021 | Mader et al. | |
| 2022/0191511 | A1 | 6/2022 | Takagi et al. | |
| 2023/0152461 | A1 | 5/2023 | Tisdale et al. | |

FOREIGN PATENT DOCUMENTS

| | | | |
|---|---|---|---|
| JP | 2018-181159 | A | 11/2018 |
| JP | 2020-529002 | A | 10/2020 |
| WO | 2019/131075 | A1 | 7/2019 |
| WO | 2020/183839 | A1 | 9/2020 |

OTHER PUBLICATIONS

European Search Report issued on the corresponding European Patent Application No. 21928955.0 on Mar. 13, 2025, in 12 pages.

* cited by examiner

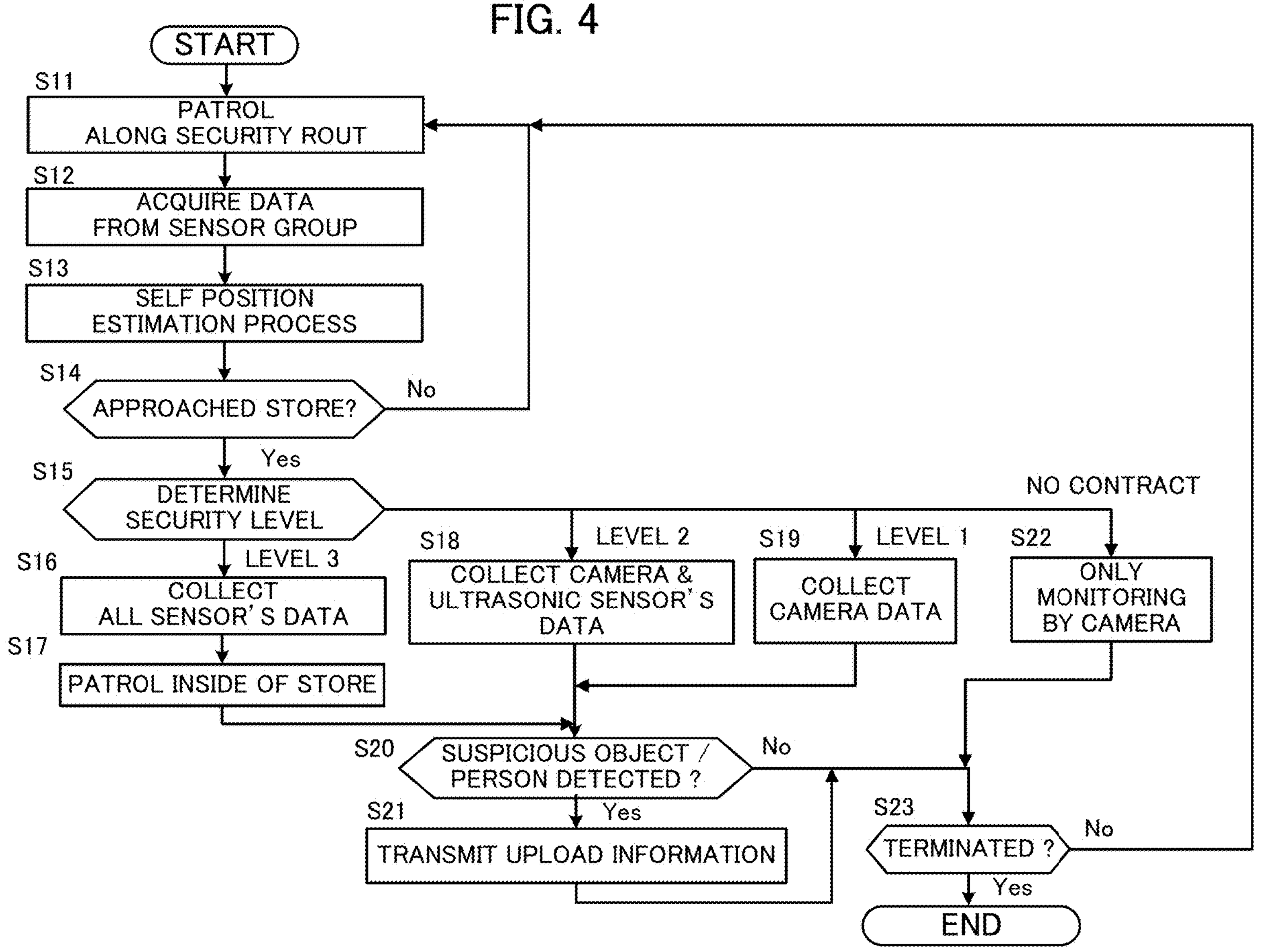
FIG. 4
START
S11
PATROL ALONG SECURITY ROUT
S12
ACQUIRE DATA FROM SENSOR GROUP
S13
SELF POSITION ESTIMATION PROCESS
S14
APPROACHED STORE?
No
Yes
S15
DETERMINE SECURITY LEVEL
LEVEL 3
S16
COLLECT ALL SENSOR'S DATA
S17
PATROL INSIDE OF STORE
LEVEL 2
S18
COLLECT CAMERA & ULTRASONIC SENSOR'S DATA
LEVEL 1
S19
COLLECT CAMERA DATA
NO CONTRACT
S22
ONLY MONITORING BY CAMERA
S20
SUSPICIOUS OBJECT / PERSON DETECTED ?
No
Yes
S21
TRANSMIT UPLOAD INFORMATION
S23
TERMINATED ?
No
Yes
END

STOP DATA COLLECTION
1
COLLECT DATA
1
DATA COLLECTION RANGE

INFORMATION PROCESSING DEVICE, CONTROL METHOD, PROGRAM, AND STORAGE MEDIUM

CROSS-REFERENCE TO RELATED APPLICATIONS

This application is US National Stage of International Patent Application PCT/JP2021/007698 filed Mar. 1, 2021, the contents of which are incorporated herein by reference.

TECHNICAL FIELD

The present disclosure relates to processing of measured data.

BACKGROUND

Conventionally, there is known a laser radar device configured to radiate a pulse of laser light into a target space of detection and detect an object in the target space based on the level of the reflection light. For example, Patent Literature 1 discloses a lidar configured to scan the peripheral space by appropriately controlling the emission direction (scanning direction) of the light pulse to be repeatedly emitted and measure the return light thereby to generate point cloud data indicating peripheral object information such as distance information and reflectance information.

PRIOR ART DOCUMENTS

Patent Literature

Patent Literature 1: JP2018-009831A

SUMMARY

Problem to be Solved by the Invention

In such a case where point cloud data generated according to a predetermined scanning period by measurement equipment such as a lidar is uploaded to a server device which collects and manages the point cloud data, data amount of the generated point group data is so large that the data communication load and the processing load of the server device could become excessive. In addition, in the case of an aircraft such as a drone, if it collects the point group data at a constant data rate, the storage thereof will be full soon. Thus, there is an issue that it can fly only a relatively short time.

The present disclosure has been made in order to solve the above issue, and it is an object of the present invention to provide an information processing device capable of suitably reducing the amount of measured data.

Means for Solving the Problem

One invention is an information processing device including:

- an acquisition unit configured to acquire measured data generated by measurement equipment;
- a determination unit configured to determine a compression mode of the measured data, based on compression related information regarding the compression mode of data in accordance with a position and/or a posture; and
- a compression unit configured to compress the measured data, based on the compression mode.

Another invention is a control method executed by a computer, the control method including:

- acquiring measured data generated by measurement equipment;
- determining a compression mode of the measured data, based on compression related information regarding the compression mode of data in accordance with a position and/or a posture; and
- compressing the measured data, based on the compression mode.

Still another invention is a program causing a computer to:

- acquire measured data generated by measurement equipment;
- determine a compression mode of the measured data, based on compression related information regarding the compression mode of data in accordance with a position and/or a posture; and
- compress the measured data, based on the compression mode.

BRIEF DESCRIPTION OF THE DRAWINGS

FIG. 4 It is an example of a flowchart showing a processing procedure performed by the information processing device in the first application example.

DETAILED DESCRIPTION OF PREFERRED EMBODIMENTS

Figure 1:
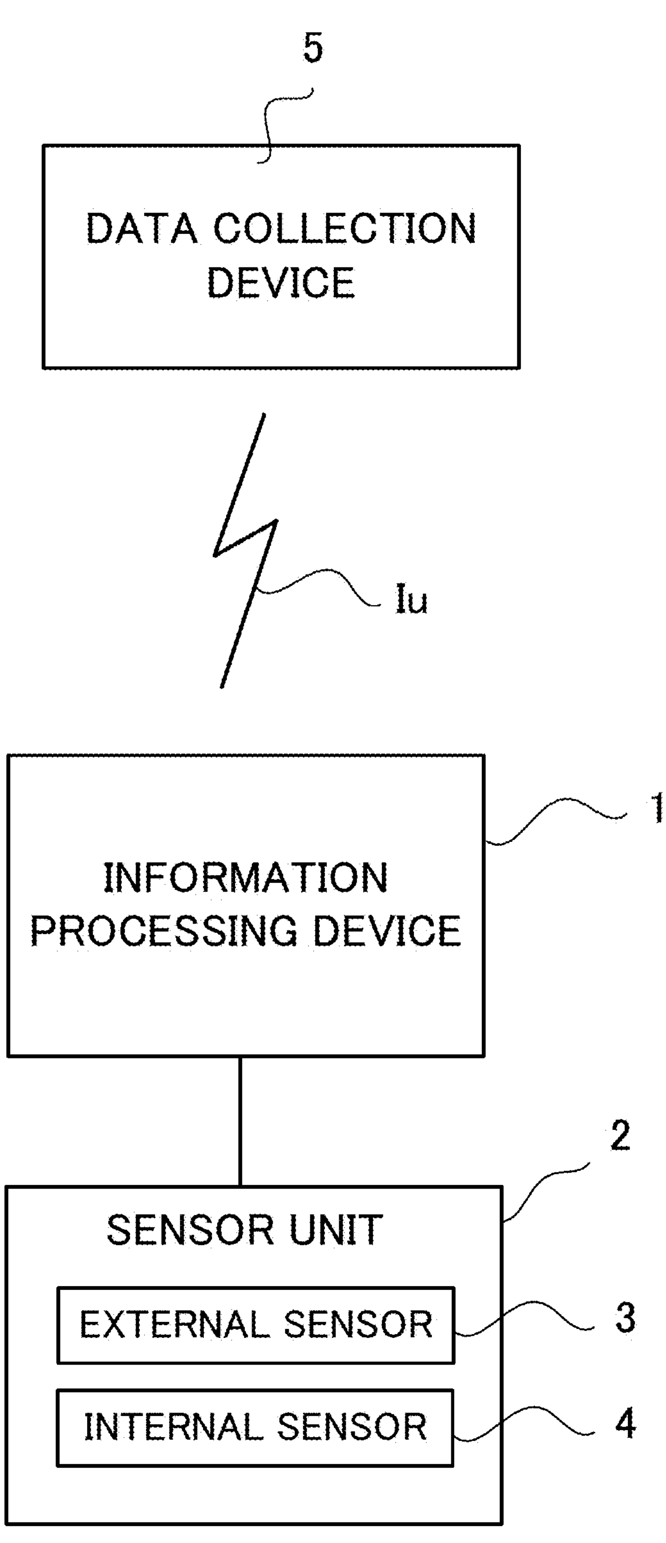
FIG. 1 It is a schematic configuration diagram of a data collection system.

According to a preferred embodiment of the present invention, there is provided an information processing device including: an acquisition unit configured to acquire measured data generated by measurement equipment; a determination unit configured to determine a compression mode of the measured data, based on compression related information regarding the compression mode of data in accordance with a position and/or a posture; and a compression unit configured to compress the measured data, based on the compression mode. According to this mode, the information processing device can compress measured data in accordance with the position and/or the posture.

In one mode of the information processing device, the information processing device further includes a transmission unit configured to transmit the measured data compressed by the compression unit to a data collection device. According to this mode, the information processing device can suitably reduce the amount of data to be transmitted to the data collection device.

In another mode of the information processing device, the information processing device further includes a self position estimation unit configured to perform a self position estimation, wherein the determination unit is configured to determine the compression mode, based on the position and/or the posture estimated by the self position estimation and the compression related information. According to this mode, the information processing device can suitably determine the compression mode of the measured data in accordance with the estimate of the self position.

In still another mode of the information processing device, the measurement equipment is mounted on an aircraft, wherein the compression related information is information which specifies at least an altitude of a collection range of the data, and wherein the compression unit is configured to determine whether or not to store the measured data, based on the compression related information and the position and/or the posture estimated by the self position estimation. According to this mode, the information processing device accurately determines whether or not to store the measured data according to the altitude of the aircraft, which enables the information processing device to suitably compress the amount of data to be stored.

In still another mode of the information processing device, the measurement equipment is provided in a security robot, wherein the compression related information includes information regarding security levels of stores to be guarded, and wherein the determination unit is configured to determine the compression mode, based on a security level corresponding to a store measured by the measurement equipment. According to this mode, in such a case that the security robot guards stores, the information processing device can suitably determine the data compression mode based on the security level corresponding to the store.

In still another mode of the information processing device, the measurement equipment includes plural types of external sensors, wherein the compression unit is configured to select the measured data outputted by the external sensors as the monitoring data so as to increase the number of the types of the external sensors to be used for the monitoring data with an increase in the security level. According to this mode, the information processing device can suitably determine the types of the external sensors to be used for monitoring, in accordance with the security level.

In still another mode of the information processing device, the compression unit is configured to compress data which is obtained by excluding data corresponding to a moving object to from the measured data. According to this mode, the information processing device can obtain data from which unwanted data regarding moving objects is suitably excluded when the objective is to measure structures and the like.

According to another preferred embodiment of the present invention, there is provided control method executed by a computer, the control method including: acquiring measured data generated by measurement equipment; determining a compression mode of the measured data, based on compression related information regarding the compression mode of data in accordance with a position and/or a posture; and compressing the measured data, based on the compression mode. By executing this control method, the computer can suitably compress the measured data in accordance with the position and/or a posture.

According to still another preferred embodiment of the present invention, there is provided a program executed by a computer, the program causing the computer to: acquire measured data generated by measurement equipment; determine a compression mode of the measured data, based on compression related information regarding the compression mode of data in accordance with a position and/or a posture; and compress the measured data, based on the compression mode. By executing the program, the computer can suitably compress the measured data in accordance with the position and/or posture. In some embodiments, the program is stored in a storage medium.

EMBODIMENTS

Hereinafter, preferred embodiments of the present invention are described below with reference to drawings.

(1) OVERVIEW OF DATA COLLECTION SYSTEM

FIG. 1 is a schematic configuration of a data collection system according to the present embodiment. The data collection system includes an information processing device 1 that processes data generated by the sensor group 2, and a data collection device 5 that is a server device configured to collect and manage data.

The information processing device 1 is electrically connected to the sensor group 2, and performs compression of data (including selection of data) outputted by the sensor group 2, and transmits the compressed data as upload information "Iu" to the data collection device 5. Examples of the information processing device 1 include a moving body, such as a vehicle, a drone, and a self-propelled robot, and a computer configured to control the moving body. The information processing device 1 may be, for example, a navigation device mounted on a moving body such as a vehicle and a ship, or may be an electronic control device incorporated in the moving body.

The sensor group 2 includes an external sensor 3, an internal sensor 4. The external sensor 3 is one or more sensors for sensing the external environment of the information processing device 1 or the moving body on which the information processing device 1 is mounted. Examples of the external sensor 3 include a ranging sensor such as a lidar, a camera, and an ultrasonic sensor. The inner field sensor 4 is one or more sensors for sensing the inner field of the information processing device 1 or the moving body on which the information processing device 1 is mounted. Examples of the internal sensor 4 include an angular velocity sensor, a GNSS (Global Navigation Satellite System) receiver, an acceleration sensor, an IMU (Inertial Measurement Unit), and an autonomous positioning device. Thus, the sensor group 2 includes various sensors used for self-position estimation, obstacle detection, human detection, and the like. At least a part of the sensors of the sensor group 2 may be incorporated in the information processing device 1.

The data collection device 5 is a device configured to collect measured data by a lidar, receives an upload information Iu from the information processing device 1, and stores the received upload information Iu. In FIG. 1, although only one set of the information processing device 1 and the sensor group 2 is illustrated, instead, a plurality of sets of the information processing device 1 and the sensor group 2 may be present. In this instance, the data collection device 5 receives the upload information Iu from the information processing devices 1.

Here, the data transmitted from the information processing device 1 to the data collection device 5 as the upload information Iu may be data outputted by all of the external sensors 3, or may be data outputted by a particular sensor of the external sensor 3. As will be described later, in order to reduce the amount of data of the upload information Iu, the information processing device 1 may select one or more sensors to be used for generating the upload information Iu according to the measurement situation and include data outputted by the selected sensors in the upload information Iu. In addition to the data outputted by the external sensor 3, the upload information Iu may include information regarding the self-position and the posture (i.e., the measured position and the posture) estimated by the information processing device 1 and information regarding the measurement time.

(2) CONFIGURATION OF INFORMATION PROCESSING DEVICE

Figure 2:
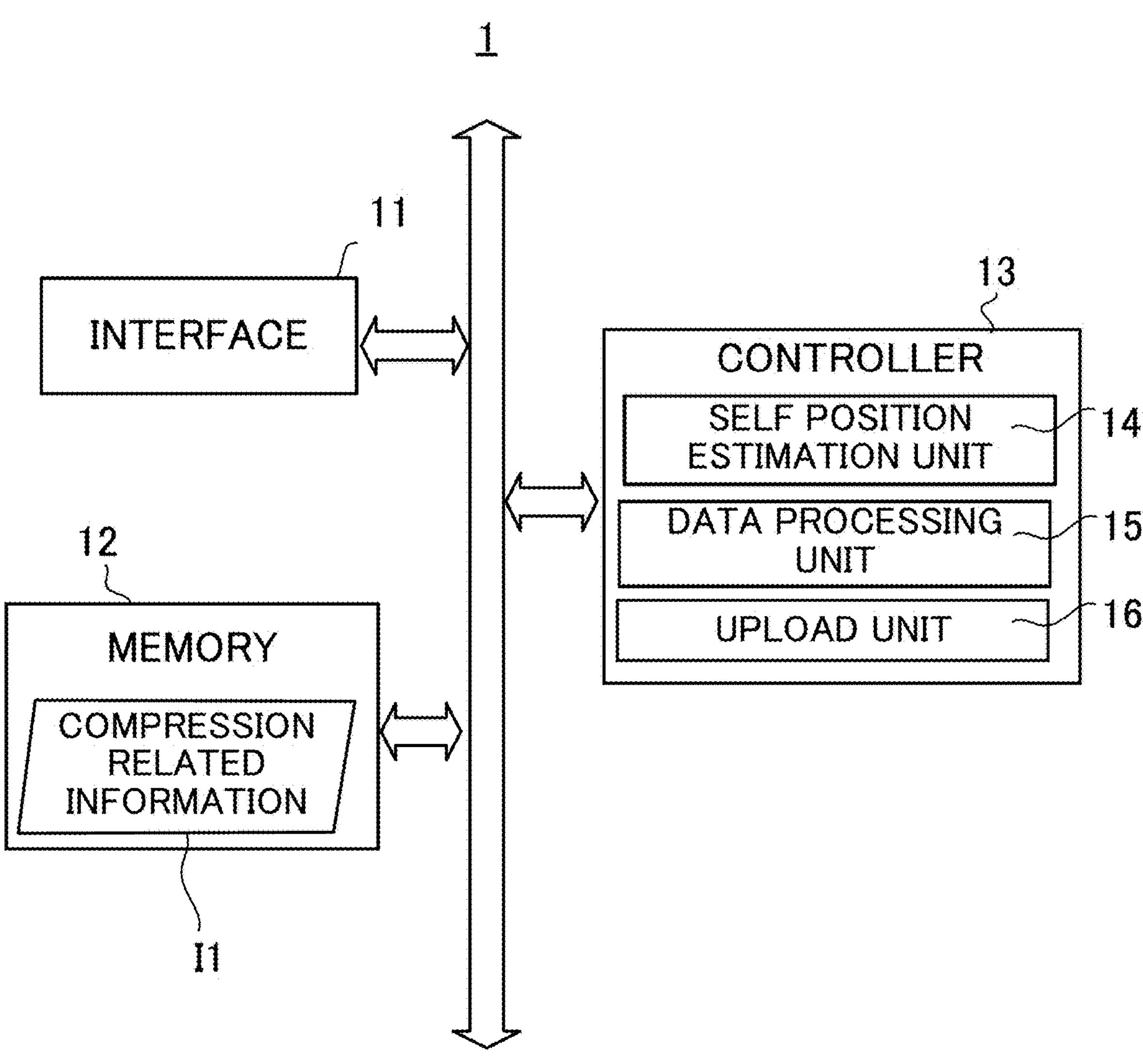
FIG. 2 It is a block diagram of an information processing device.

FIG. 2 is a block diagram illustrating an example of a hardware configuration of the information processing device 1. The information processing device 1 mainly includes an interface 11, a memory 12, and a controller 13. Each of these elements is connected to each other through a bus line.

The interface 11 performs the interface operation related to the exchange of data between the information processing device 1 and an external device. In this example, the interface 11 acquires the output data from the sensor group 2, and supplies it to the controller 13. The interface 11 transmits the upload information Iu generated by the controller 13 to the data collection device 5 under the control of the controller 13. Further, when the information processing device 1 is mounted on a moving object such as a vehicle, the interface 11 may supply a signal related to the control of the moving object generated by the controller 13 to an electronic control device (ECU: Electronic Control Unit) of the moving object. Examples of the interface 11 include a wireless interface, such as a network adapter, for performing wireless communication, and a hardware interface, such as a cable, for connecting to an external device. The interface 11 may also perform interface operations with various peripheral devices such as input devices, display devices, sound output devices, and the like.

The memory 12 is configured by various volatile and non-volatile memories such as a RAM (Random Access Memory), a ROM (Read Only Memory), a hard disk drive, a flash memory, and the like. The memory 12 stores a program for the controller 13 to perform a predetermined process. The program executed by the controller 13 may be stored in a storage medium other than the memory 12.

Further, various information related to the process performed by the controller 13 is stored in the memory 12. For example, the memory 12 stores compression related information 11.

The compression related information I1 is information for specifying a compression mode for the measured data obtained from the sensor group 2 depending on the measurement position of the information processing device 1 or the measured position. Here, the "information for specifying a compression mode" may be information in which the compression rate is specified, or may be information in which a compression algorithm (including an algorithm of lossy compression and algorithm of lossless compression) is specified, or may be information in which data (sensor type) to be included in the upload information Iu is specified. For example, the compression related information I1 is information in which information regarding a position is associated with information for specifying the compression mode for the measured data measured by the information processing device at the position (or the measured data generated when the position is set to be a measurement target).

It is noted that the compression related information I1 may be a part of map data. In this instance, the compression related information I1 may be a part of the map data in the movement area of the information processing device 1. In this case, the map data includes information for specifying the compression mode as a part of the information representing the attributes of a feature such as a facility.

The controller 13 includes one or more processors, such as a CPU (Central Processing Unit), a GPU (Graphics Processing Unit), and a TPU (Tensor Processing Unit), and controls the entire information processing unit 1. In this case, the controller 13 executes a program stored in the memory 12 or the like to perform various processing described later.

The controller 13 functionally includes a self position estimation unit 14, a data processing unit 15, and an upload unit 16.

The self position estimation unit 14 performs self position estimation based on data generated by the sensor group 2 and generates information (hereinafter, simply referred to as "present position information") representing the present position and posture of the information processing device such as own orientation (Yaw component) and inclination (Roll component and Pitch component). In this case, the self position estimation unit 14 may generate the present position information by any self position estimation method. For example, the self position estimation unit 14 may generate the present position information based on the output from a GNSS receiver, an IMU, or the like included in the sensor group 2. In another example, the self position estimation unit 14 may generate the present position information by executing a self position estimation method using the measured data from the external sensor 3 and the map data. Examples of such a self position estimation technique include a self position estimation technique based on measured data of landmarks and map data of landmarks, and a self position estimation technique based on NDT (Normal Distribution Transform) matching using voxel data. The self position estimation unit 14 may perform self position estimation based on a SLAM (Simultaneous Localization and Mapping).

The data processing unit 15 generates data (also simply referred to as "compressed data") obtained by compressing data generated by the sensor group 2 based on the present position information and the compression related information I1. Specifically, the data processing unit 15 identifies the compression mode linked to the position indicated by the present position information by referring to the compression related information I1. Then, by applying the specified compression mode, the data processing unit 15 generates compressed data from the data generated by the sensor group 2.

The upload unit 16 transmits the upload information Iu including the compressed data generated by the data processing unit 15 to the data collection device 5 through the interface 11. In this case, for example, the upload device 16 may sequentially transmit the compressed data generated by the data processing unit 15 to the data collection device 5, or may transmit it to the data collection device 5 collectively at predetermined time intervals.

The controller 13 functions as the "acquisition unit", "determination unit", "compression unit", "self position estimation unit", "transmission unit" and a computer or the like to execute the program.

The process performed by the controller 13 is not limited to being implemented in software by a program, but may be implemented by any combination of hardware, firmware, and software. For example, the process performed by the controllers 13 may also be implemented using a user programmable integrated circuit such as a FPGA (Field-Programmable Gate Array) and a microcomputer. In this case, the program executed by the controller 13 in this embodiment may be realized by the above-mentioned integrated circuit.

(3) APPLICATION EXAMPLES

Next, application examples (first application example and second application example) of specific processes of the information processing device 1 will be described.

(3-1) First Application Example: Security in Commercial Facility

As a first application example, a case where the information processing device 1 is a self-propelled robot to be used for a security application in a commercial facility such as a shopping mall will be specifically described. Hereafter, although it is herein assumed that the information processing device 1 itself is a self-propelled robot, the present invention is not limited thereto. The information processing device 1 may be a device that controls a self-propelled robot (including remote control by data communication).

Figure 3:
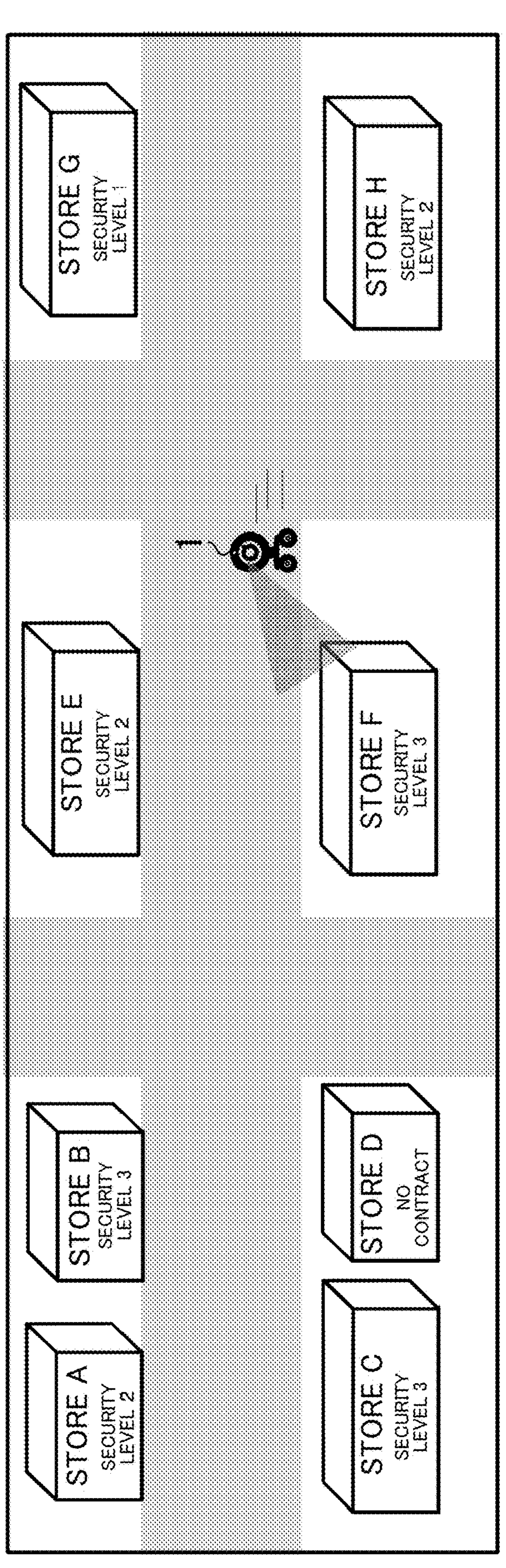
FIG. 3 It is a map of a commercial facility in which the information processing device, which is a self-propelled robot, operates.

FIG. 3 shows a map of a commercial facility in which the information processing device 1, which is a self-propelled robot, operates. The information processing device 1 is a self-propelled robot that patrols and guards stores existing within a predetermined range in a commercial facility, and incorporates the sensor group 2 and the traveling mechanism. Then, in each store, the security level on a scale of three "1" to "3" is set depending on the contract of security service concluded in advance, and in addition, there are also stores (stores without contract) that have not concluded any security contract. In the example shown in FIG. 3, among the stores A to H, the store G has the security level 1, the store A and the store H have the security level 2, the store B, the store C and the store F have the security level 3, and the store D has not concluded any security service contract. It is noted that the scale of the security level is not limited to three stages, and it may be set to two stages or a predetermined stage of four or more stages.

Then, if the information processing device 1 approaches a store which concluded a contract of a security service with a high security level, the information processing device 1 collects high-definition information by raising the level of information collection to use the collected data as monitoring data. Here, the "monitoring data" is data to be used for monitoring a suspicious object/a suspicious person or for generating the upload data Iu. On the other hand, if the information processing device 1 approaches a store which concluded a contract of a security service with a low security level, the information processing device 1 lowers the level of information collection, and uses the data collected according to the lowered level as monitoring data. In this case, the level of information collection is adjusted by the number of types of sensors (i.e., sensors that output data to be used as monitoring data). Specifically, the information processing device 1 increases the number of types of sensors to be used for monitoring with increasing security level. In other words, the information processing device 1 increases the number of types of sensors which outputs measured data to be selected as monitoring data with an increase in the security level. Further, the information processing device 1 passes through any stores which has not concluded the security service, without collecting information in the vicinity of the stores.

In the first application example, the compression related information I1 includes information indicating the types of sensors to be used for monitoring, in accordance with the security level and information regarding the security level (and presence or absence of the contract) for each store. Then, the information processing device 1 refers to the compression related information I1 and specifies the types of sensors to be used for monitoring in each store. In the first application example, for example, a facility map (map data) indicating the position of each store in a commercial facility to be guarded by the information processing device 1 is stored in the memory 12 or the like, and the information processing device 1 identifies the position of each store by referring to the facility map. In this instance, unique identification information (store ID) is allocated to each store, and the above-described identification information is used in the facility map and in the compression related information I1.

FIG. 4 is an example of a flowchart illustrating a processing procedure that is executed by the information processing device 1 in the first application example. In FIG. 4, as an example, the information processing device 1 monitors each store according to the security level and if a suspicious object or a suspicious person is detected, the information processing device 1 transmits data used for monitor to the data collection device 5 as the upload information Iu. Further, here, as an example, the information processing device 1 is assumed to include at least a camera, a lidar, and an ultrasonic sensor as the external sensor 3.

First, the information processing device 1 patrols along the security route (step S11). In this case, for example, security route information indicating a predetermined security route is stored in the memory 12 or the like, and the information processing device 1 performs travel control based on the security route information. In this instance, the information processing device 1 may perform the traveling control so that the position of the information processing device 1 follows the security route based on the position of the information processing device 1 estimated in the self-position estimation process executed at step S13 to be described later.

Then, the information processing device 1 acquires the data outputted by the sensor group 2 (step S12). The information processing device 1 performs a self position estimation process on the basis of the data acquired at step S12 (step S13).

Then, the information processing device 1 determines whether or not it has approached any store (step S14). For example, the information processing device 1 determines whether or not a store exists within a predetermined distance, based on the facility map and the position of the information processing device 1 estimated at step S13. For example, the predetermined distance described above is a distance in consideration of the measurement maximum distance or the like of the external sensor 3 and is stored in advance in the memory 12 or the like. Then, if it is determined that the information processing device 1 has not approached any store (step S14; No), the information processing device 1 gets back to the process at step S11.

When it is determined that the information processing device 1 has approached a store (step S14; Yes), the information processing device 1 makes a determination (including determination of whether or not there is a contract for security service, hereinafter the same) of the security level of the store which the information processing device 1 has approached (step S15). In this case, for example, the information processing device 1 determines the security level of the store which the information processing device 1 has approached, by referring to the compression related information I1.

Then, if the information processing device 1 determines that the security level of the store (target store) which the information processing device 1 has approached is level 3 that is the highest level (step S15; level 3), the information processing device 1 collects data outputted by all external sensors 3 (including the camera, lidar, and ultrasonic sensor) as monitoring data (step S16). The monitoring data is data to be used in the determination of a suspicious object and a suspicious person at step S21 to be described below. The information processing device 1 may enter the target store according to a contract with the target store and patrol the inside of the target store (step S17).

On the other hand, if the security level of the target store is level 2 (step S15; level 2), the information processing device 1 collects data outputted by the camera and the ultrasonic sensor as monitoring data (step S18). Further, if the security level of the target store is level 1 (step S15; level 1), the information processing device collects data outputted by the camera as monitoring data (step S19).

If one of the processes at step S17, step S18, or the step S19 is executed, the information processing device 1 determines whether or not any suspicious object or suspicious person is detected based on the monitoring data (step S20). In this case, the information processing device 1 may detect the suspicious object and suspicious person based on any suspicious object/person detection technique using an external sensor (e.g., a technique employed in a self-propelled to security robot that performs suspicious object/person detection).

If a suspicious object or a suspicious person is detected (step S20; Yes), the information processing device 1 transmits the data collected at step S17, step S18, or step S19 to the data collection device 5 as the upload information Iu (step S21). In this instance, the information processing device 1 may perform compression by any compression algorithm on the data collected is at step S17, step S18, or step S19.

On the other hand, if the information processing device 1 determines that there is no contract of the security service in the determination of the security level of the target store (step S15; no contract), the information processing device 1 performs only monitoring by the camera (step S22). In this instance, the information processing device 1 does not transmit the data generated at step S22 to the data collection device 5.

If the information processing device 1 does not detect any suspicious object or any suspicious person (step S20; No), or after the information processing device 1 has finished the process at step S21 or step S22, the information processing device 1 determines whether or not the process should be terminated (step S23). In this case, for example, if the information processing device 1 has reached the end point of the security route, the information processing device 1 determines that the process should be terminated. If it is determined that the process should be terminated (step S23; Yes), the information processing device 1 terminates the process of the flowchart. In this case, for example, the information processing device 1 returns to a predetermined chargeable storage position. On the other hand, if it is determined that the process should not be terminated (step S23; No), the information processing device 1 gets back to the process at step S11 and continues to perform the patrol.

According to the process of the present flowchart, the information processing device 1 transmits the upload information Iu only when any suspicious object or suspicious person is detected, and selects the data to be included in the upload information Iu according to the security level, which leads to suitable reduction of the data amount of the upload information Iu.

Next, a supplementary description will be given of technical effects related to the first application example.

Robotic security is becoming more realistic in shopping malls and other commercial facilities which include multiple stores as tenants. At present, there are many cases in which security guard staff patrols each shop, but the patrol security using security robots equipped with sensors is also expected to be popularized in the future. In the current situation, security robots often patrol common areas and collect data regardless of location, notify security companies when they discover suspicious objects and/or suspicious persons, and send collected data of suspicious objects and/or suspicious persons. On the other hand, it is assumed that the security service to to be provided to each store requires an individual level of security depending on each store instead of across-the-board measure. In such a case, it is necessary to take measures such as the control of information to be collected precisely for each store and the control of information to be sent to security companies. If each store cannot be identified individually, it is difficult to perform such a service.

In view of the above, in the first application example, the information processing device 1 performs information collection and transmission control according to the store, based on the information (facility map and compression related information I1) in which the position information regarding each store is linked to the security level (and the compression mode depending on the security level) of the each store. Thereby, the information processing device 1 can reduce the processing load and the amount of data transmission.

(3-2) Second Application Example: Data Collection by Drone

Next, according to a second application example, it is assumed that the information processing device 1 is a drone (unmanned aircraft) equipped with a lidar, and a specific description will be hereinafter given of the case of collecting the terrain (feature) data in accordance with the altitude information and area. Hereinafter, although a description on the assumption that the information processing device 1 itself is a drone will be given, the information processing device 1 is not limited thereto and may be a device configured to control a drone (including remote control by data communication).

Figure 5:
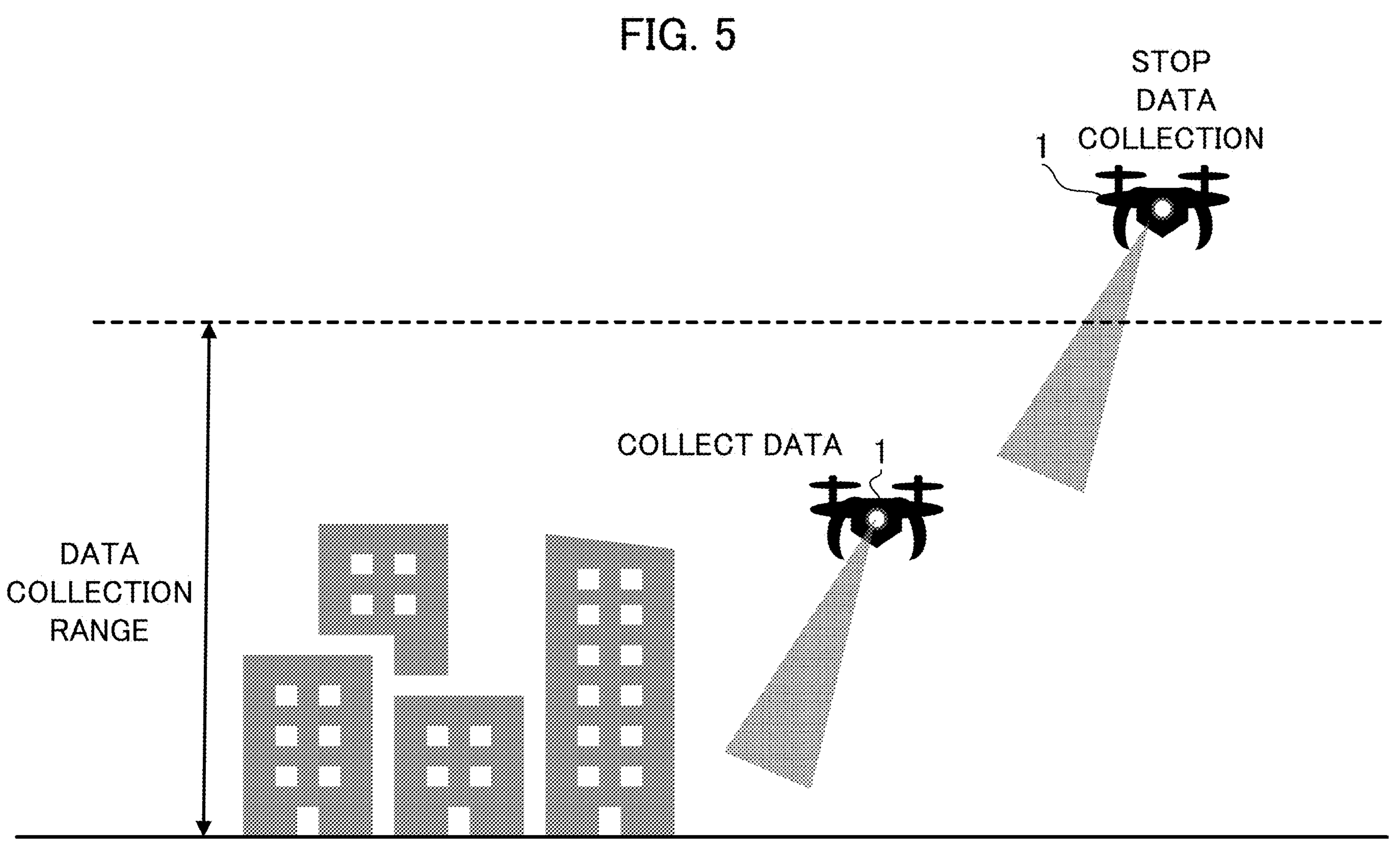
FIG. 5 It is a diagram showing an outline of data collection in the second application example.

FIG. 5 is a diagram showing an outline of data collection in the second application example. In the second application example, the data collection range is set according to the altitude of the drone, and the data collection rate is controlled according to the flight altitude. When the objective is the collection of terrain (topographic) data, there is no problem even if the data collection is stopped when the drone is flying at a position higher than the distance measurable range of geographic features. In view of the above, in the second application example, if the altitude of the information processing device 1 is equal to or higher than a threshold value, the information processing device 1 stops the data collection by the lidar. Only when the altitude is less than the threshold, the information processing device 1 performs data collection by the lidar. The above-described threshold value is set to be an upper limit value of the altitude of the information processing device 1 capable of ranging a feature. Thereby, the information processing device 1 can reduce the processing load and the amount of data transmission. When data collection is performed at a constant data rate at all times regardless of the position, altitude, and speed of the drone, there arises a problem that the volume of the storage mounted on the drone will reach the upper limit and flight only for a relatively short time can be performed. In contrast, the information processing device 1 in the second application example sets the data collection range, and then determines that it is necessary to store the measured data in accordance with the data collection range. Thus, it is possible to suitably eliminate the problem of flight time based on the capacity limit of the memory 12.

If feature information (including information regarding the positions and heights of buildings) is stored in advance in the memory 12, the information processing device 1 may is adaptively change the threshold value of the altitude based on the present position information and the feature information. In this case, the information processing device 1 identifies the distance measurement range of the lidar based on the position estimated by the self position estimation, and only when the position of a feature indicated by the feature information is included in the identified distance measurement range of the lidar, the information processing device 1 performs the data collection by using the lidar. In this case, for example, information regarding the maximum measurement distance of the lidar is previously stored in the memory 12 or the like, and the information processing device 1 determines that the range within the above-described maximum measurement distance from the position estimated by the self position estimation is the distance measurement range of the lidar.

The information processing device 1 may determine whether or not it is necessary to collect data, based on the inclination of its own posture as an index other than the altitude. In this case, for example, the information processing device 1 may also stop the data collection if it is determined, based on the posture estimated by the self position estimation, that any feature is not included in the field of view of the external sensor 3 such as a lidar. In this case, the information processing device 1 identifies the distance measurement range of the lidar based on the position and the posture estimated by the self position estimation, and only when the position of any feature indicated by the feature information is included in the identified distance measurement range of the lidar, the information processing device 1 collects the data by the lidar. In this way, the information processing device 1 may reduce the volume of the collected data by adaptively controlling the amount of data collection based on its own posture.

Figure 6:
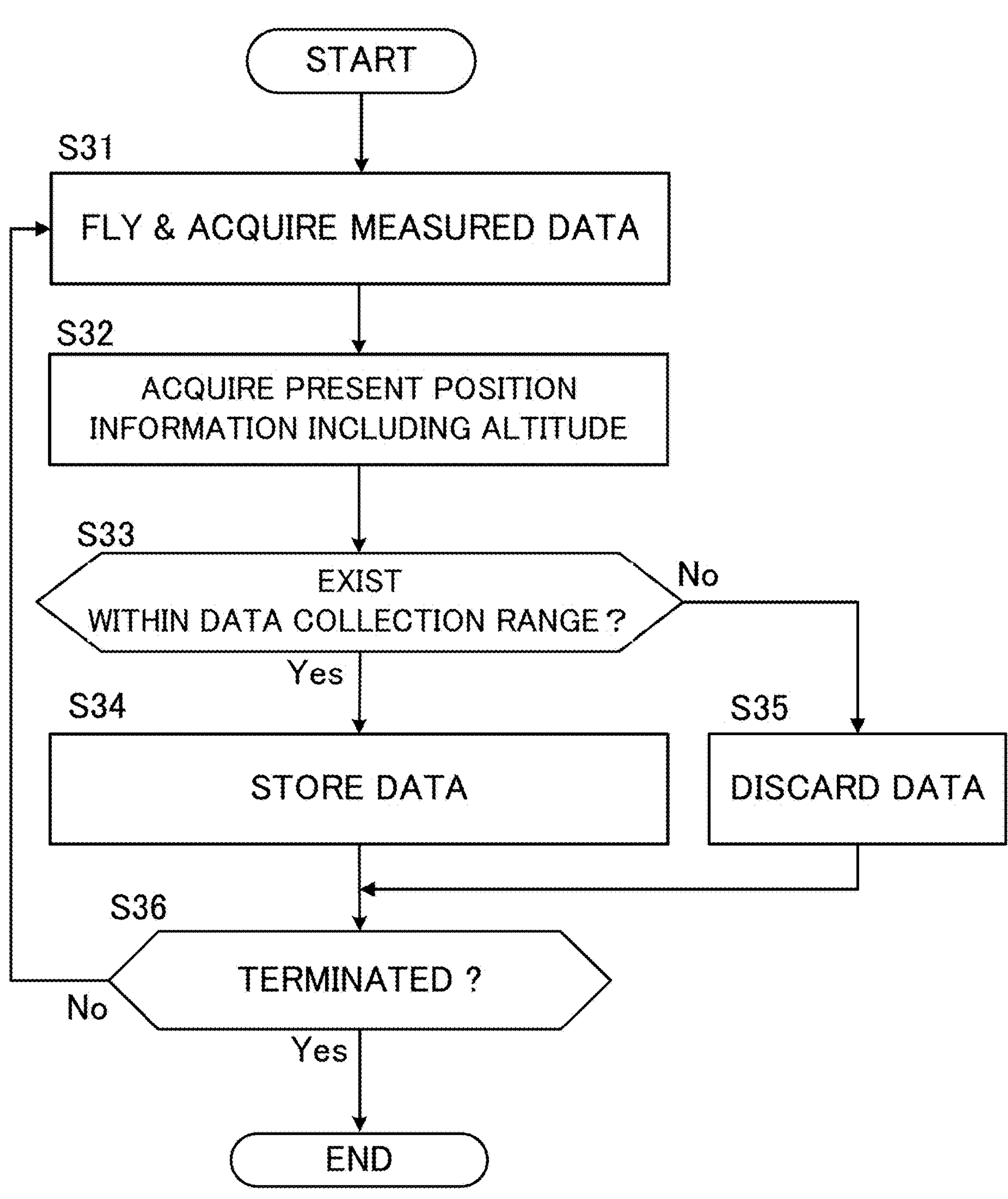
FIG. 6 It is an example of a flowchart showing a processing procedure performed by the information processing device in the second application example.

FIG. 6 is an example of a flowchart illustrating a processing procedure that is executed by the information processing device 1 in the second application example.

First, the information processing device 1 makes flights, and acquires the data measured by the lidar (step S31). In this case, if there is information defining the target trajectory of movement of the information processing device 1, the information processing device 1 may fly along the target trajectory. Instead, the information processing device 1 may make flights by receiving an external control signal based on the manual operation.

Next, the information processing device 1 acquires the present position information indicating the present position including the altitude, based on the data outputted by a GPS receiver included in the sensor group 2 (step S32). Then, the information processing device 1 determines whether or not the information processing device 1 exists within the data collection range (step S33). In this case, the data collection range is a range that the altitude is at least defined, and the information processing device 1 determines whether or not the present position indicated by the present position information belongs to the data collection range.

When it is determined that the information processing device 1 exists in the data collection range (step S33; Yes), the information processing device 1 stores the data acquired at step S31 in the memory 12 (step S34). The information processing device 1 transmits the data stored in the memory 12 to the data collection device 5 at a predetermined timing. On the other hand, when it is determined that the information processing device 1 does not exist in the data collection range (step S33; No), the information processing device 1 discards the data acquired at step S31 without storing it in the memory 12 (step S35). Thus, the information processing device 1 can effectively compress the data to be stored and transmitted. When the information processing device 1 does not exist in the data collection range, the information processing device 1 may reduce the collection rate of the data by a predetermined rate, instead of discarding the measured data.

Then, the information processing device 1 determines whether or not the process should be terminated (step S36). When it is determined that the process should not be terminated (step S36; Yes), the information processing device 1 ends the process of the flowchart. On the other hand, if it is determined that the process should not be terminated (step S36; No), the information processing device 1 gets back to the process at step S31.

Thus, according to the second application example, the information processing device 1 determines whether or not the measured data is to be stored, based on the altitude at the time of measurement. Thus, the information processing device 1 can suitably reduce the amount of data to be stored and transmitted.

As described above, the controller 13 of the information processing device 1 according to the present embodiment is configured to acquire measured data outputted by a sensor group 2 that is measurement equipment. Then, the controller 13 is configured to determine a compression mode of the measured data, based on the compression related information I1 regarding compression mode of data in accordance with a position and/or a posture. Then, the controller 13 compresses the measured data based on the determined compression mode. Thus, the controller 13 can suitably reduce the amount of data of the measured data.

(4) MODIFICATIONS

The information processing device 1 may detect a moving object and exclude data corresponding to the moving object from the data subjected to storage and transmission.

For example, provided that the information processing device 1 is mounted on a vehicle to acquire the measured data necessary for the generation of the map data while travelling on the road, the information processing device 1 needs only the data of the structures such as a road and a building and does not need the information regarding the moving object such as a truck and a bicycle. Therefore, in this case, the information processing device 1 deletes the measured data of the moving object from the measured data generated by the external sensor 3 and stores and transmit the remaining measured data to data collection device 5.

Figure 7:
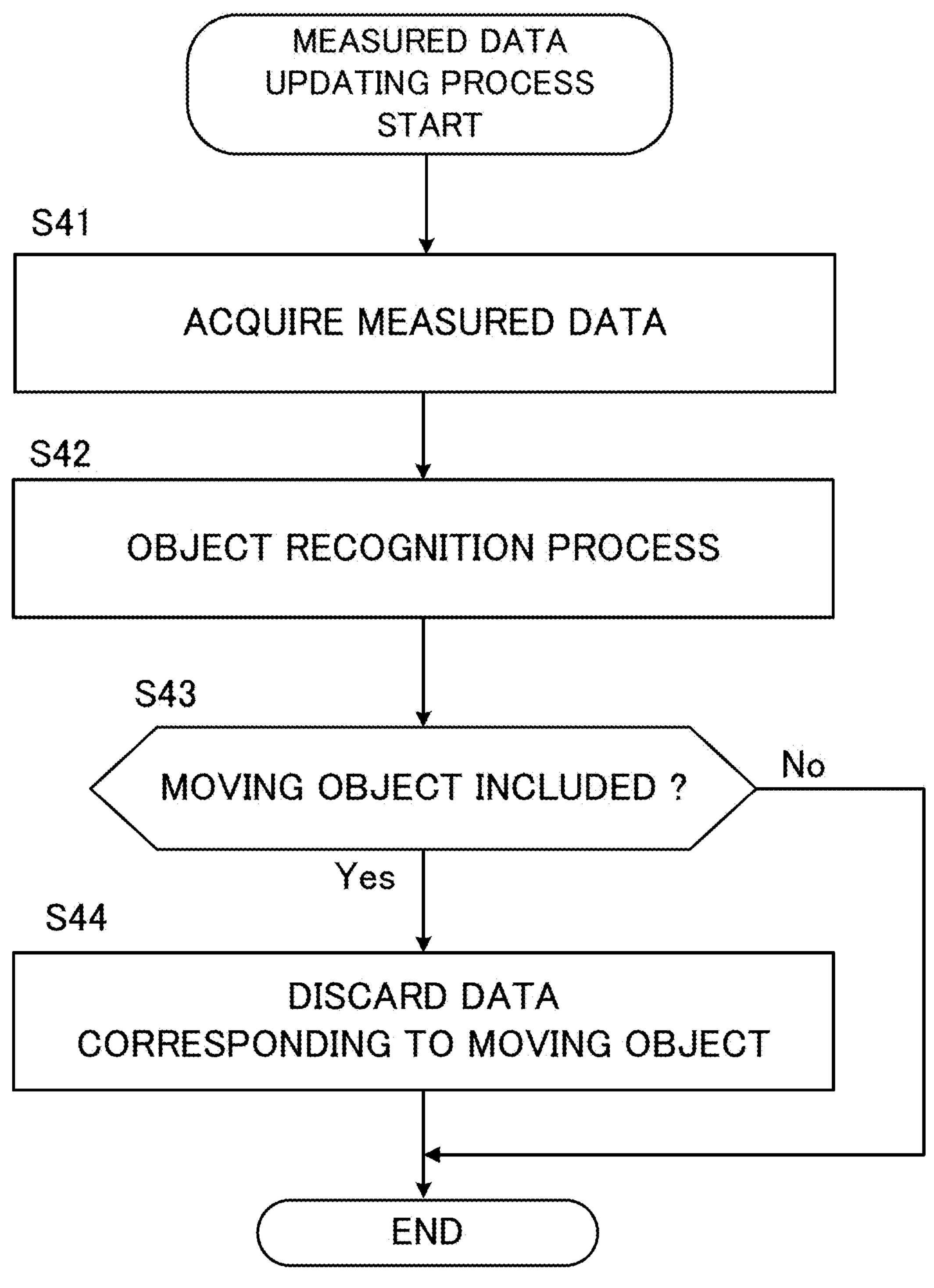
FIG. 7 It is an example of a flowchart showing a procedure of the measured data updating process in a modification.

FIG. 7 is an example of a flowchart illustrating a procedure of the updating process of measured data according to the present modification. The information processing device 1 executes the process of the flowchart shown in FIG. 7, for example, at step S31 in FIG. 6 in the second application example.

First, the information processing device 1 acquires the measured data outputted by the external sensor 3 such as a lidar (step S41). Then, the information processing device 1 performs an object recognition process on the basis of the measured data acquired at step S41 (step S42). In this case, for example, the information processing device 1 recognizes the type of each object detected in the measurement range based on the measured data by applying any object recognition technique.

Then, the information processing device 1 determines whether or not any moving object is included in the measured objects (step S43). In this case, if the information processing device 1 recognizes the type of each object at step S42, the information processing device 1 determines that objects which fall under particular types (e.g., a person, a car, and the like) as a moving object.

If it is determined that the measured objects include any moving object (step S43; Yes), the information processing device 1 discards the data corresponding to the moving object from the measured data acquired at step S41 (step S44). On the other hand, if the information processing device 1 determines that a moving object is not included in the measured objects (step S43; No), the information processing device 1 ends the process of the flowchart. Thereafter, the information processing device 1 performs compression (including selection of data) of the measured data according to the position by referring to the compression related information I1, and stores the compressed data in the memory 12 and transfers it to the data collection device 5.

According to the process of the flowchart, the information processing device 1 can suitably exclude the data of the moving object from the target data of storage and transmission.

Here, a supplementary description will be given of the present modification. Point group data generated by a lidar can be applied to creation of a map for autonomous driving and three-dimensional space data of the inside of a store. In order to generate such a space, basically only data of stationary structures is required, and it is desirable to be able to acquire only data in to which moving objects such as vehicles and humans are eliminated. For atypical environment of a highway, it is difficult to obtain data while eliminating data of vehicles and humans. Instead, in practice, after collecting data including data of moving objects, such a method is used that moving objects are detected and the data of the detected moving objects are eliminated when a data collection device 5 or the like performs a process of constructing a space using a SLAM or the like based on the upload information Iu. In this case, since the data collection device 5 needs to collect all data generated by the information processing device 1 including the data of the moving object, there is an issue that it is difficult to reduce the amount of data transmission.

In view of the above, the information processing device 1 according to the modification example, by excluding the data corresponding to the moving objects from the target data to be stored and transmitted, it is possible to suppress the shortening of the flight time due to the limitation of the storage capacity of the drone while suitably reducing the data transmission amount.

In the embodiments described above, the program is stored by any type of a non-transitory computer-readable medium (non-transitory computer readable medium) and can be supplied to a control unit or the like that is a computer. The non-transitory computer-readable medium include any type of a tangible storage medium. Examples of the non-transitory computer readable medium include a magnetic storage medium (e.g., a flexible disk, a magnetic tape, a hard disk drive), a magnetic-optical storage medium (e.g., a magnetic optical disk), CD-ROM (Read Only Memory), CD-R, CD-R/W, a solid-state memory (e.g., a mask ROM, a PROM (Programmable ROM), an EPROM (Erasable PROM), a flash ROM, a RAM (Random Access Memory)).

While the present invention has been described with reference to the embodiments, the present invention is not limited to the above embodiments. Various modifications that can be understood by a person skilled in the art can be made to the configuration and details of the present invention within the scope of the present invention. Namely, the present invention includes, of course, various modifications that may be made by a person skilled in the art according to the entire disclosure including claims and technical ideas. In addition, all Patent and Non-Patent Literatures mentioned in this specification are incorporated by reference in its entirety.

DESCRIPTION OF REFERENCE NUMERALS

1 Information processing device
2 Sensor group
3 External sensor
4 Internal sensor
5 Data collection device

What is claimed is:

1. An information processing device comprising:
a processor coupled to a memory storing instructions for the processor to:
acquire measured data generated by a measurement equipment;
determine a compression mode of the measured data, based on compression related information regarding the compression mode of data in accordance with a position and/or a posture; and
compress the measured data, based on the compression mode,
wherein the measurement equipment is provided in a security robot,
wherein the compression related information includes information regarding security levels of stores to be guarded, and
wherein the processor is configured to determine the compression mode, based on a security level corresponding to a store measured by the measurement equipment.

2. The information processing device according to claim 1,
wherein the memory further stores instructions for the processor to transmit the measured data that is compressed to a data collection device.

3. The information processing device according to claim 1,
wherein the memory further stores instructions for the processor to perform a self position estimation, wherein the processor is configured to determine the compression mode, based on the compression related information and the position and/or the posture estimated by the self position estimation.

4. The information processing device according to claim 3, wherein the measurement equipment is mounted on an aircraft, wherein the compression related information is information which specifies at least an altitude of a collection range of the data, and wherein the processor to determine whether or not to store the measured data, based on the compression related information and the position and/or the posture estimated by the self position estimation.

5. The information processing device according to claim 1, wherein the measurement equipment includes plural types of external sensors, and wherein the processor is configured to select the measured data outputted by the external sensors as monitoring data so as to increase the number of the types of the external sensors to be used for the monitoring data with an increase in the security level.

6. The information processing device according to claim 1, wherein the processor is configured to compress data which is obtained by excluding data corresponding to a moving object from the measured data.

7. A control method executed by a computer, the control method comprising:

acquiring measured data generated by a measurement equipment;

determining a compression mode of the measured data, based on compression related information regarding the compression mode of data in accordance with a position and/or a posture; and compressing the measured data, based on the compression mode, wherein the measurement equipment is provided in a security robot, wherein the compression related information includes information regarding security levels of stores to be guarded, and wherein the compression mode is determined based on a security level corresponding to a store measured by the measurement equipment.

8. A non-transitory computer readable medium storing a program executed by a computer, the program causing the computer to:

acquire measured data generated by a measurement equipment;

determine a compression mode of the measured data, based on compression related information regarding the compression mode of data in accordance with a position and/or a posture; and compress the measured data, based on the compression mode, wherein the measurement equipment is provided in a security robot, wherein the compression related information includes information regarding security levels of stores to be guarded, and wherein the compression mode is determined based on a security level corresponding to a store measured by the measurement equipment.

* * * * *